(12) United States Patent
Huang et al.

(10) Patent No.: US 11,143,942 B2
(45) Date of Patent: Oct. 12, 2021

(54) PROJECTION APPARATUS

(71) Applicant: Coretronic Corporation, Hsin-Chu (TW)

(72) Inventors: Wen-Jui Huang, Hsin-Chu (TW); Tsung-Ching Lin, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/896,252

(22) Filed: Jun. 9, 2020

(65) Prior Publication Data
US 2020/0387058 A1 Dec. 10, 2020

(30) Foreign Application Priority Data
Jun. 10, 2019 (CN) .......................... 201910495499.0

(51) Int. Cl.
*G03B 21/16* (2006.01)
*H05K 7/20* (2006.01)

(52) U.S. Cl.
CPC ........... *G03B 21/16* (2013.01); *H05K 7/2039* (2013.01); *H05K 7/20136* (2013.01)

(58) Field of Classification Search
CPC ........... G03B 21/16; G03B 21/14; H05K 7/20
See application file for complete search history.

(56) References Cited

U.S. PATENT DOCUMENTS

| | | | | |
|---|---|---|---|---|
| 7,740,379 B2* | 6/2010 | Lin | ......................... | G03B 21/16 362/294 |
| 2009/0304199 A1* | 12/2009 | DeMoss | .................... | G06F 1/20 381/71.1 |
| 2010/0066982 A1* | 3/2010 | Hsieh | ...................... | G03B 21/16 353/61 |
| 2011/0157560 A1* | 6/2011 | Hsiao | ...................... | G03B 21/16 353/58 |
| 2014/0092368 A1* | 4/2014 | Dai | ......................... | G03B 21/16 353/58 |

FOREIGN PATENT DOCUMENTS

| | | |
|---|---|---|
| CN | 103324013 A | 9/2013 |
| TW | I289426 B | 11/2007 |

* cited by examiner

*Primary Examiner* — Michelle M Iacoletti
*Assistant Examiner* — Danell L Owens (57) ABSTRACT

A projection apparatus includes a casing, a projection lens, a first fan, a second fan, and a heat sink assembly. The casing has an air inlet and an air outlet. The projection lens is disposed in the casing, and between the air inlet and the air outlet. The first fan is disposed in the casing, and between the projection lens and the air inlet. The second fan is disposed in the casing, and between the projection lens and the air outlet. The heat sink assembly is disposed in the casing and between the projection lens and the air inlet. The first fan has a first rotational speed, the second fan has a second rotational speed. The second rotational speed is larger than the first rotational speed. The projection apparatus has the advantages of low development cost and effectively lowering the influence of the heat on the image quality.

8 Claims, 7 Drawing Sheets

PROJECTION APPARATUS

CROSS-REFERENCE TO RELATED APPLICATION

This application claims the priority benefit of China application CN201910495499.0 filed on 2019 Jun. 10. The entirety of the above-mentioned patent application is hereby incorporated by reference herein and made a part of this specification.

FIELD OF THE INVENTION

The invention relates to a projection apparatus.

BACKGROUND OF THE INVENTION

A fan disposed inside a projection apparatus, which drives an inlet air flow entering the projection apparatus from an air inlet to cool the internal components of the projection apparatus and exhausts an outlet air flow outgoing from an air outlet to the outside of the projection apparatus. Generally, to enhance the heat dissipation performance of the heat sink assembly inside the projection apparatus, the heat sink assembly is placed at the position closest to the air inlet. However, after passing through heat sink assembly, the inlet air flow becomes increase in temperature and then forming an internal air flow with high temperature. Before arriving at the air outlet, the high-temperature internal air flow passes through a temperature-sensitive projection lens, so that the temperature of the projection lens is increased and thereby causing the problem of poor quality in the image projected by the projection apparatus.

To avoid poor quality of the image projected by the projection apparatus due to the high temperature, the conventional means usually employs: reducing the volume of the heat sink assembly to avoid the high-temperature internal air flow from passing through the projection lens; adding fans under the projection lens to enhance the heat dissipation; and expanding the internal space of the projection apparatus to reduce the temperature inside the projection apparatus. Unfortunately, the aforementioned means for avoiding poor quality of the image still increase the temperature of the components of the heat sink assembly, the component cost of the projection device, or the size of the projection assembly, resulting in the projection apparatus with poor image quality of the projected image and high the development cost.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

The invention provides a projection apparatus, which has the advantages of low development cost and lowering the influence of the heat on the image quality.

Other advantages and objects of the invention may be further illustrated by the technical features broadly embodied and described as follows.

In order to achieve one or a portion of or all of the objects or other objects, an embodiment of the invention provides a projection apparatus including a casing, a projection lens, a first fan, a second fan, and a heat sink assembly. The casing has an air inlet and an air outlet. The projection lens is disposed in the casing and between the air inlet and the air outlet. The first fan is disposed in the casing and between the projection lens and the air inlet. The second fan is disposed in the casing and between the projection lens and the air outlet. The heat sink assembly is disposed in the casing and between the projection lens and the air inlet. The first fan has a first rotational speed, the second fan has a second rotational speed, and the second rotational speed is larger than the first rotational speed.

In the projection apparatus of the invention, by means that the second rotational speed of the second fan is larger than the first rotational speed of the first fan, on the basis of not increasing the additional development cost for improving the heat dissipation performance, the air flow passing through the heat sink assembly and bringing with a large amount of heat may quickly pass through the projection lens, arrive at the second fan, and leave the inside of the casing, and thereby effectively reducing the temperature of the heat sink and the temperature of the airflow inside the casing and avoiding overheating of the light source device and degradation of the image quality. Therefore, the projection apparatus the invention has the advantages of low development cost and effectively lowering the influence of the heat on the image quality at the same time.

Other objectives, features and advantages of The invention will be further understood from the further technological features disclosed by the embodiments of The invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing", "faces", and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1:
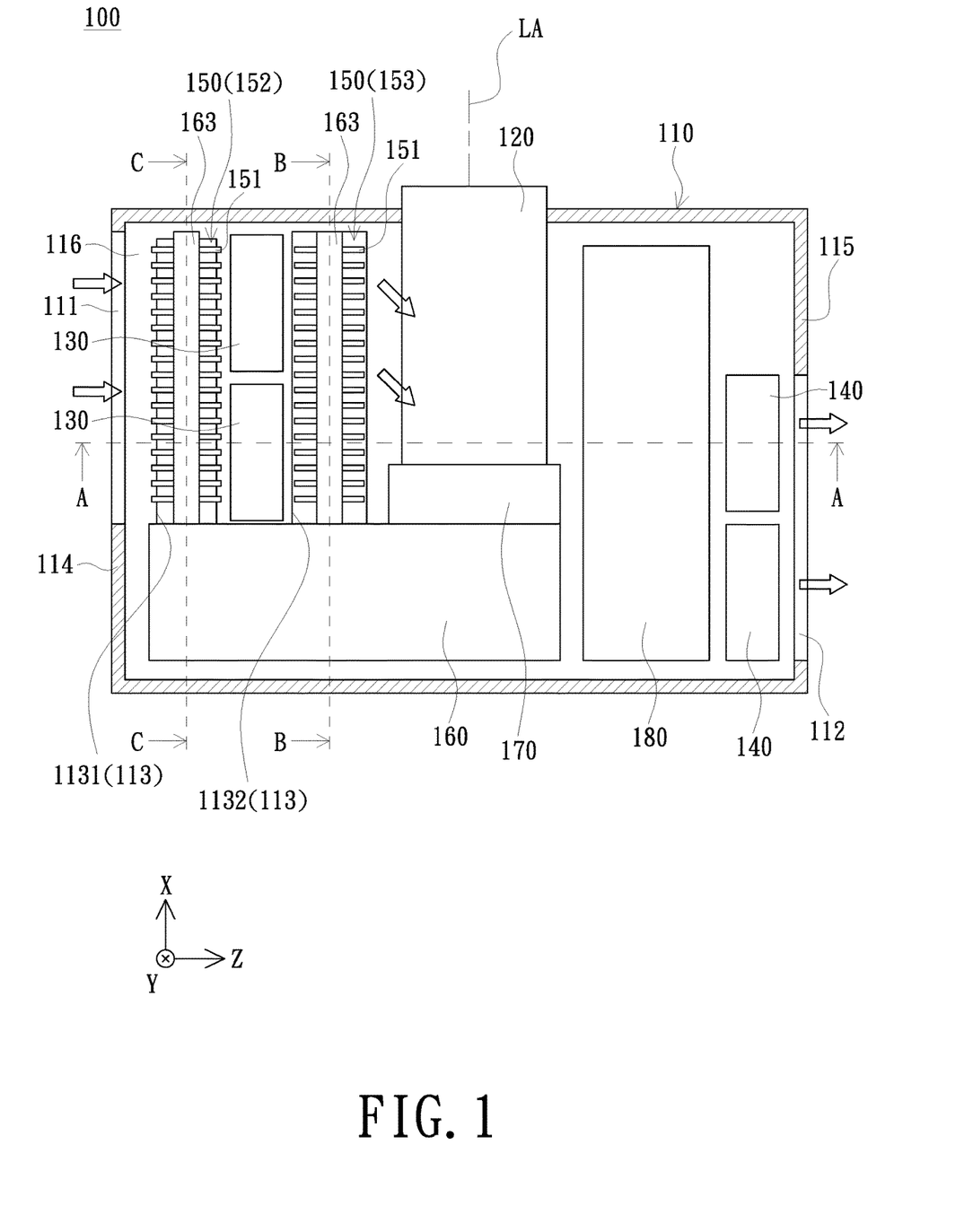
FIG. 1 is a schematic system configuration of a projection apparatus according to an embodiment of the invention.
Figure 2:
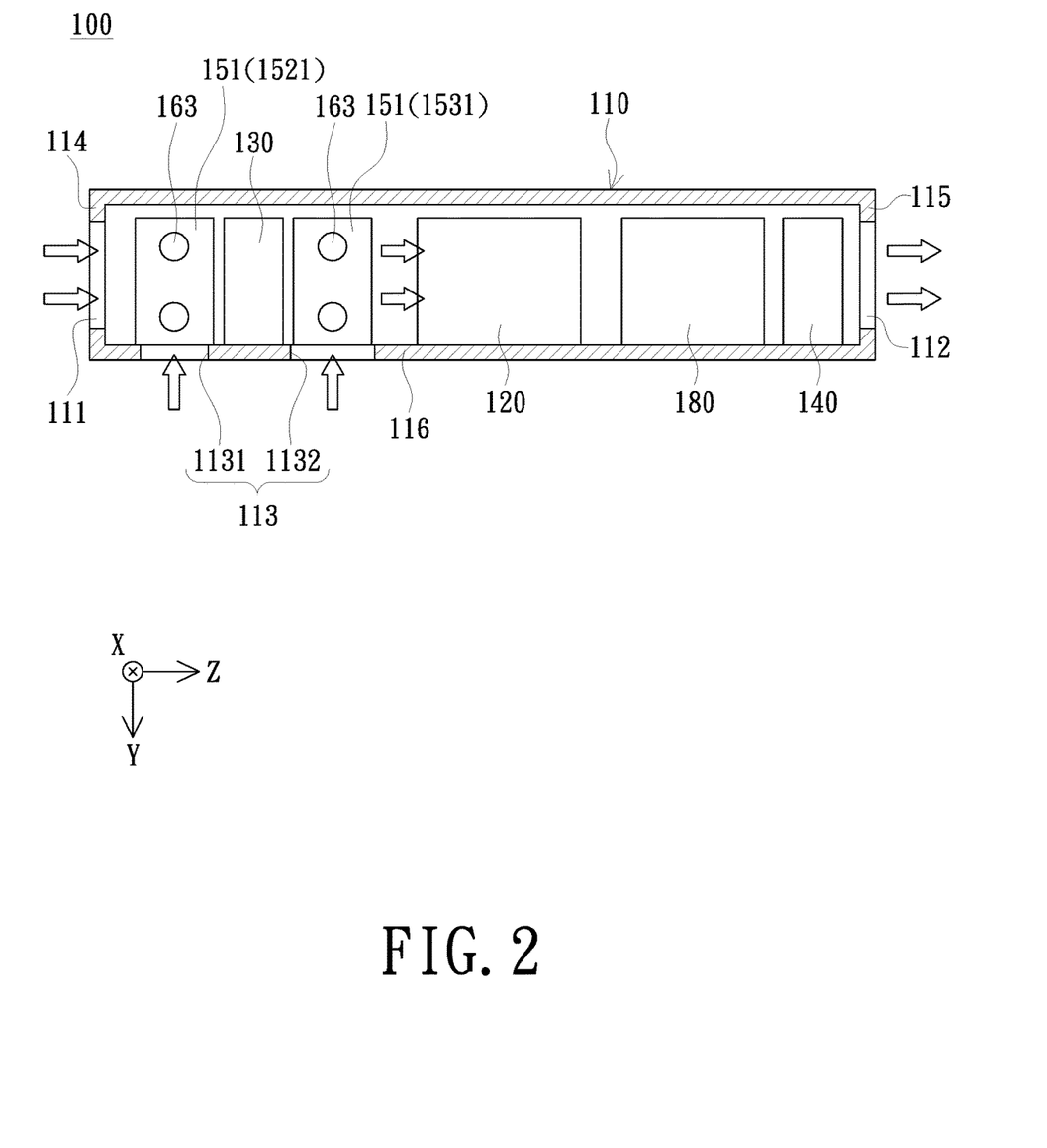
FIG. 2 is a schematic sectional view along an A-A cut line in FIG. 1.
Figure 3:
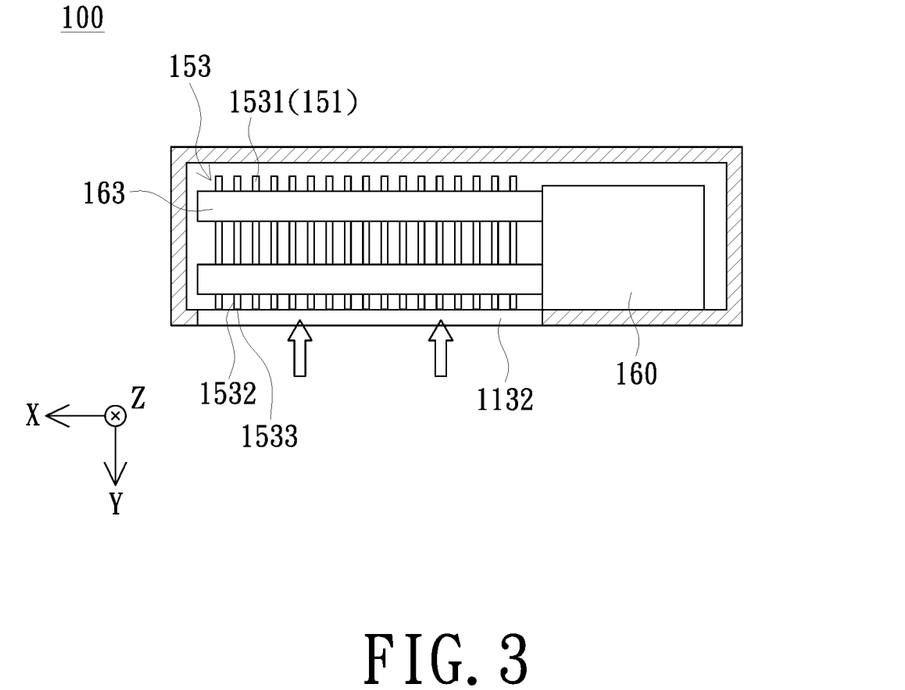
FIG. 3 is a schematic profile drawing along a B-B cut line in FIG. 1.
Figure 4:
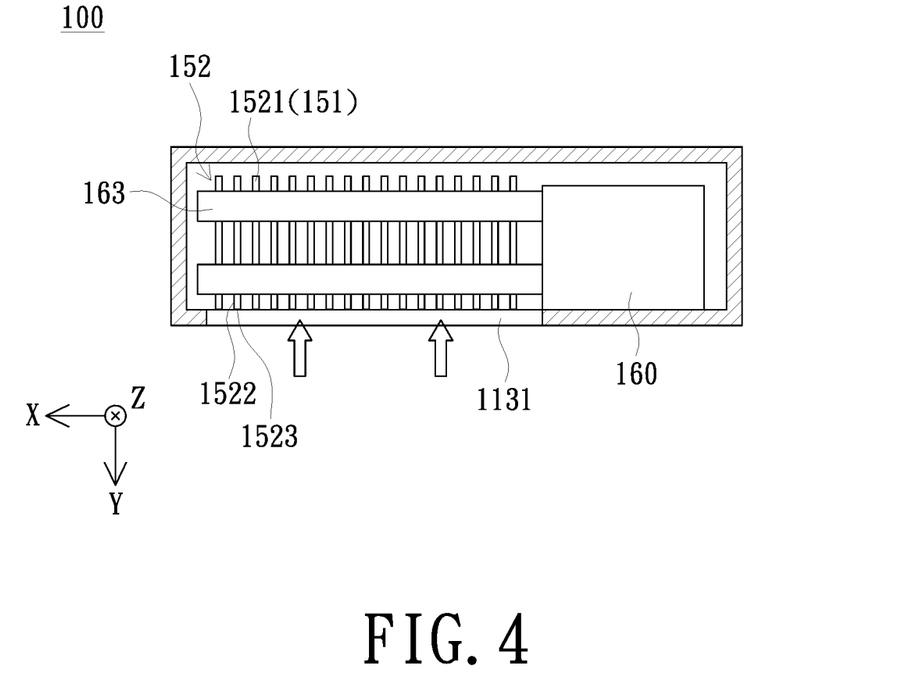
FIG. 4 is a schematic profile drawing along a C-C cut line in FIG. 1.

FIG. 1 is a schematic system configuration of a projection apparatus according to an embodiment of the invention. FIG. 2 is a schematic sectional view along an A-A cut line in FIG. 1. FIG. 3 is a schematic profile drawing along a B-B cut line in FIG. 1. FIG. 4 is a schematic profile drawing along a C-C cut line in FIG. 1. Referring to FIGS. 1 to 4, the projection apparatus 100 of the embodiment includes a casing 110, a projection lens 120, a first fan 130, a second fan 140, and a heat sink assembly 150. The casing 110 has an air inlet 111 and an air outlet 112. The projection apparatus 110 is, for example, a projector. The projection lens 120 is disposed in the casing 110 and between the air inlet 111 and the air outlet 112. The first fan 130 is disposed in the casing 110 and between the projection lens 120 and the air inlet 111. The second fan 140 is disposed in the casing 110 and between the projection lens 120 and the air outlet 112. The heat sink assembly 150 is disposed in the casing 110 and is located next to the first fan 130. The heat sink assembly 150 is disposed between the projection lens 120 and the air inlet 111. The projection lens 120 has an optical axis LA. The optical axis LA is vertical to the air flow direction at the air inlet 111. The first fan 130 has a first rotational speed. The second fan 140 has a second rotational speed. The second rotational speed is larger than the first rotational speed.

In the embodiment, the material of the casing 110 may be metals or plastics. The shape of the casing 110 is substantially rectangular, but the casing 110 also may be a geometric shape such as cylinder, cube, and the like, or a non-geometric shape. The invention does not limit the shape of the casing 110. In addition, the first fan 130 and the second fan 140 may be, for example, axial-flow fans, centrifugal fans, or forced-draft fans. The number of the first fan 130 may be one or more, and the number of the second fan 140 may be one or more. In the embodiment, the numbers of the first fan 130 and the second fan 140 are two, but the invention does not limit the types and the numbers of the first fan 130 and the second fan 140. Further, the projection lens 120 includes, for example, a combination of one or more optical lenses having non-zero diopter. For example, a variety of combinations of non-planar lenses including a biconcave lens, a biconvex lens, a concavo-convex lens, a convexo-concave lens, a plano-convex lens, a plano-concave lens, and the like, may be used. In other embodiments, the projection lens 120 may also include a planar optical lens. The invention does not limit the types and species of the projection lens 120.

The heat sink assembly 150 mentioned above includes a heat-dissipating fin 151. The heat-dissipating fin 151 is disposed between the first fan 130 and the air inlet 111 or the first fan 130 and the projection lens 120, and the number of the heat-dissipating fin 151 may be one or more. In the embodiment, the number of the heat-dissipating fin 151 is more than one. The heat-dissipating fins 151 are sequentially arranged at intervals, and the arrangement direction of the heat-dissipating fins 151 and an axial direction of the first fan 130 are not parallel. In addition, the casing 110 may further have an opening portion 113. The opening portion 113 and the heat-dissipating fins 151 are corresponding in positions, and the arrangement direction of the heat-dissipating fins 151 and an opening direction of the opening portion 113 are not parallel. In the embodiment, heat dissipation surfaces of two adjacent heat-dissipating fins 151 face each other (see 1522, 1532 in FIGS. 3 and 4), and at least one periphery of the heat-dissipating fin 151 faces toward the opening portion 113 (see 1523, 1533 in FIGS. 3 and 4), but the invention is not limited thereto.

Regarding the arrangement direction of the heat-dissipating fins 151, the axial direction of the first fan 130, and the opening direction of the opening portion 113, for example, the heat-dissipating fins 151 may be sequentially arranged at intervals along a first direction X or a second direction Y, so that the heat-dissipating fins 151 may have an interval from each other in the first direction X or the second direction Y. The air flow provided by the first fan 130 flows along a third direction Z. That is, the air flow provided by the first fan 130 flows through the heat-dissipating fins 151 in the heat sink assembly 150 along a third direction Z. The first direction X, the second direction Y, and the third direction Z intersect with, and are not parallel to each other. In the embodiment, the first dissipating fins 151 are sequentially arranged along first direction X, the flow direction of the air flow provided by the first fan 130 is parallel to the third direction Z, the opening direction of the opening portion 113 faces toward the second direction Y. The first direction X, the second direction Y, and the third direction Z are vertical to each other, but the invention is not limited thereto.

The casing 110 mentioned above includes a first side wall 114, a second side wall 115, and the third side wall 116. The third side wall 116 is connected between the first side wall 114 and the second side wall 115. The air inlet 111 is formed on the first side wall 114. The air outlet 112 in formed on the second side wall 115. The opening portion 113 is disposed on the third side wall 116. In the embodiment, the casing 110 is a rectangular. The first side wall 114 may be, for example, the left side wall of the rectangular, the second side wall 115 may be, for example, the right side wall of the rectangular, the third side wall 116 may be, for example, the bottom side all of the rectangular, but the invention is not limited thereto. In addition, in the embodiment, the first side wall 114, the second side wall 115, and the third side wall 116 are sequentially arranged in the third direction Z, the optical axis LA and the first direction X are parallel to each other, and the air flow direction at the air inlet 111 is parallel to the third direction Z. In an embodiment, the air flow direction at the air inlet 111 is substantially parallel to the third direction Z.

Figure 5:
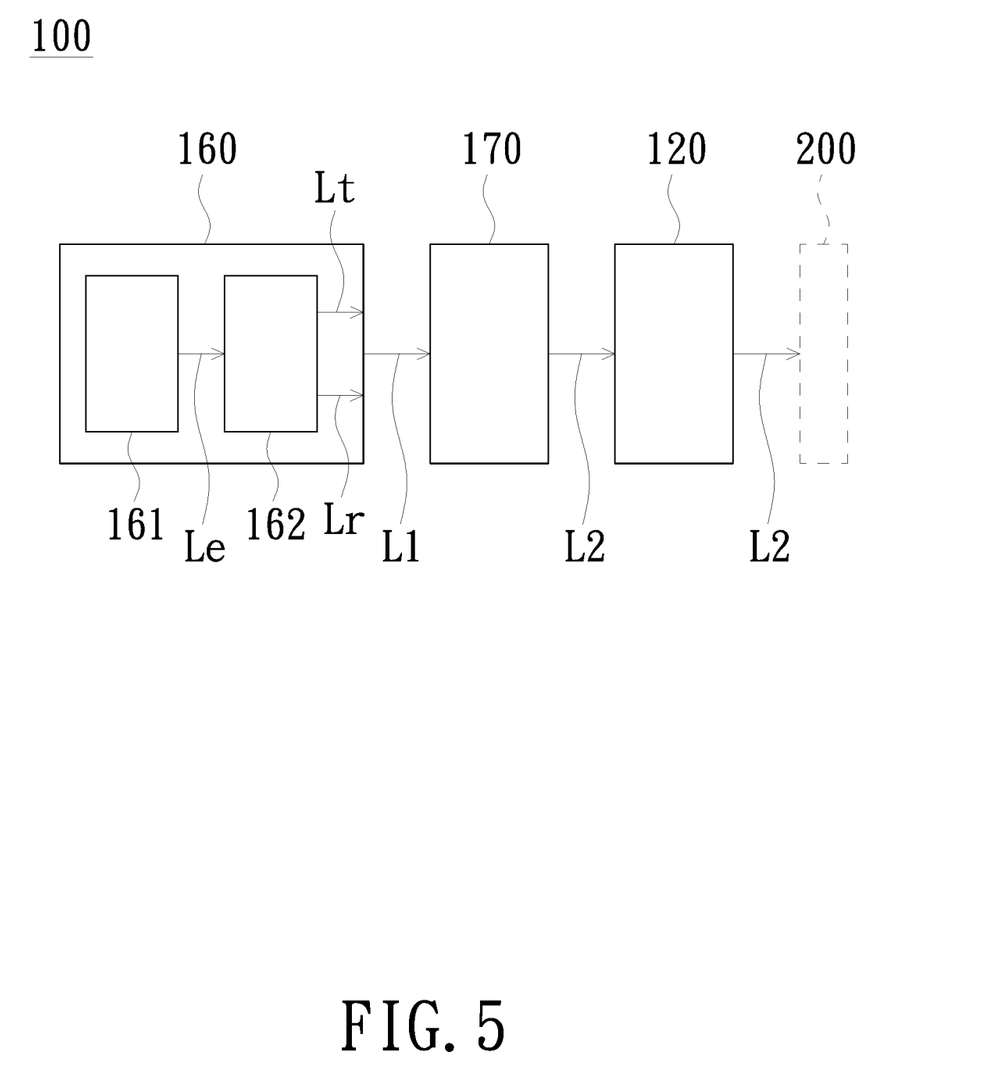
FIG. 5 is a schematic block diagram of a projection apparatus according to an embodiment of the invention.

Referring to FIG. 5, FIG. 5 is a schematic block diagram of a projection apparatus according to an embodiment of the invention. Please also refer to FIGS. 1 and 5, the projection apparatus 100 mentioned above may further include a light source device 160, a light valve 170, and a power component 180. The light source device 160, the light valve 170, and the power component 180 are disposed in the casing 110. The light source device 160 is configured to provide an illumination beam L1. The light valve 170 is disposed on a transmissive path of the illumination beam L1 to convert the illumination beam L1 into an image beam L2. The projection lens 120 is disposed on a transmissive path the image beam L2 to project the image beam L2, so as to form an image on a screen 200. In the embodiment, the power component 180 is positioned between the projection lens 120 and the second fan 140 and provides the electric power required by the projection apparatus 110, and compare with the projection lens 120, the light source device 160 is closer to the air inlet 111 than the power component 180, and the power component 180 is closer to the air outlet 112 than the light source device 160.

The light source device 160 mentioned above includes a light source 161 and a wavelength-converting wheel 162. The light source 161 is configured to provide an excitation beam Le. The light source 161 may be, for example, a module including a light emitting element, or an array including a plurality of light emitting elements, but the invention is not limited thereto. The light emitting elements may include a plurality of visible light emitting elements, a plurality of non-visible light emitting elements, or a combination of the two types of light emitting elements mentioned above, in which the visible light emitting element may be a light emitting diode (LED) or a laser diode (LD), but the invention is not limited thereto. And the light source device 160 may further include a light combining element (not shown in the figures). The light combining element is disposed between the light source 161 and the wavelength-converting wheel 162 to transmit the excitation beam Le to the wavelength-converting wheel 162, in which the light combining element may be a lens array. The lens array is arranged in an array by a plurality of lens units. Each of the lens unit may be a plano-convex lens, a plano-concave lens, a biconcave lens, a biconvex lens, a concavo-convex lens, or a convexo-concave lens. The wavelength-converting wheel 162 may convert the excitation beam Le emitted by the light source 161 into a conversion beam Lt. The illumination beam L1 includes the conversion beam Lt.

In addition, the wavelength-converting wheel 162 may have a wavelength-converting area (not shown in the figures), an optical area (not shown in the figures), and the like. The optical area may be a light transmission area or reflection area. When the wavelength-converting wheel 162 rotates, the wavelength-converting area and the optical area may cut into the transmissive path of the excitation beam Le according to chronological orders. The wavelength-converting area includes a phosphorescent material such as fluorescent materials, phosphors, a wavelength conversion material such as quantum dots, or a combination of the two materials mentioned above, but the invention is not limited thereto. When the wavelength-converting area cuts into the transmissive path of the excitation beam Le, the excitation beam Le may irradiate on the wavelength-converting area and be converted into the conversion beam Lt. When the optical area cuts into the transmissive path of the excitation beam Le, the excitation beam Le may penetrate through the optical area or be reflected by the optical area. That is, the excitation beam Le may penetrate through the light transmission area or be reflected by the reflection area. The illumination beam L1 therefore includes the conversion beam Lt and the excitation beam Le which penetrates through the optical area (light transmission area) of the wavelength-converting wheel 162 or is reflected by the optical area (reflection area) of the wavelength-converting wheel 162, and is indicated as Lr in the figures. The light valve 170 mentioned above may include a digital micromirror device (DMD), a liquid crystal on silicon (LCOS) panel, or a liquid crystal display (LCD) panel, but the invention is not limited thereto. However, in other embodiments, the light valve 170 also may be a transmissive light valve or other spatial light modulator. The number of the light valve 170 may be one or more. The detailed steps and implementations of the corresponding number of light valves 170 can be adequately taught, suggested and implemented by the ordinary knowledge in the art, and therefore will not be further described.

Please continually referring to FIGS. 1 to 4, the heat sink assembly 150 includes a first heat-dissipating fin set 152 and a second heat-dissipating fin set 153. The first heat-dissipating fin set 152 is disposed between the first fan 130 and the air inlet 111. The second heat-dissipating fin set 153 is disposed between the first fan 130 and the projection lens 120. The opening portion 113 includes a first opening 1131 and a second opening 1132. The first opening 1131 and the first heat-dissipating fin set 152 are corresponding in positions. The second opening 1132 and the second heat-dissipating fin set 153 are corresponding in positions. In the embodiment, the aperture of the first opening 1131 is different from the aperture of the second opening 1132, but the invention is not limited thereto. Specifically, the first opening 1131 and the second opening 1132 may have the same size or different sizes. For example, the first heat-dissipating fin set 152 may include the heat-dissipating fin 151 mentioned above, the heat-dissipating fin 151 of the first heat-dissipating fin set 152 may be referred as first heat-dissipating fin 1521, and the number of the first heat-dissipating fin 1521 may be one or more. In addition, the second heat-dissipating fin set 153 may include the heat-dissipating fin 151 mentioned above, the heat-dissipating fin 151 of the second heat-dissipating fin set 153 may be referred as second heat-dissipating fin 1531, and the number of the second heat-dissipating fin 1531 may be one or more. In the embodiment, the number of the first heat-dissipating fin 1521 is more than one, and the number of the second heat-dissipating fin 1531 is more than one. The first heat-dissipating fins 1521 are sequentially arranged at intervals. The second heat-dissipating fins 1531 are sequentially arranged at intervals. The arrangement direction of the first heat-dissipating fins 1521 and the axial direction of the first fan 130 are not parallel to each other, and the arrangement direction of the second heat-dissipating fins 1531 and the axial direction of the first fan 130 are not parallel to each other. In an embodiment, the heat sink assembly 150 only includes the first heat-dissipating fin set 152 or the second heat-dissipating fin set 153. In an embodiment, the fan may have no axle center, and the axial direction of the fan is equivalent to the air flow direction provided by the fan.

In addition, the arrangement direction of the first heat-dissipating fins 1521 and the opening direction of the first opening 1131 are not parallel to each other, and the arrangement direction of the second heat-dissipating fins 1531 and the opening direction of the second opening 1132 are not parallel to each other. In the embodiment, the heat dissipation surfaces 1522 of two adjacent first heat-dissipating fins 1521 faces each other, and the peripheries 1523 of the first heat-dissipating fins 1521 faces toward the first opening 1131; the heat dissipation surfaces 1532 of two adjacent second heat-dissipating fins 1531 faces each other, and the peripheries 1533 of the second heat-dissipating fins 1531 faces toward the second opening 1132, but the invention is not limited thereto. Further, the aperture of the first opening 1131 may be different from the aperture of the second opening 1132. In the embodiment, the aperture of the second opening 1132 is larger than the aperture of the first opening 1131, but the invention is not limited thereto. Partition elements may be disposed in the first opening 1131 and the second opening 1132 to block foreign objects or dust from entering the casing 110. The partition elements may be fence-shaped, mesh-shaped, and so on. In an embodiment, the partition elements may have conduction structure, for example, the partition elements may be flow guide plates.

Regarding to the relationship among the arrangement direction of the first heat-dissipating fins 1521, the axial direction of the first fan 130, and the opening direction of the first opening 1131, and the relationship among the arrangement direction of the second heat-dissipating fins 1531, the axial direction of the first fan 130, and the opening direction of the second opening 1132, the relationships are similar to the aforementioned relationship among the arrangement of the first heat-dissipating fins 151, the axial direction of the first fan 130, and the opening direction of the opening portion 113, and therefore will not be further described.

When the projection apparatus 100 of the embodiment is in use, the heat sink assembly 150 disposed next to the first fan 130 may be disposed on the heat transfer path of the light source device 160. Further, the heat of the light source device 160 may be transferred to the heat-dissipating fin 151 of the heat sink assembly 150 via the heat pipe 163. In an embodiment, the number of the light source 161 may be more than one, and the first heat-dissipating fin set 152 and the second heat-dissipating fin set 153 may dissipate the heat of the light sources 161 by different heat pipes respectively. For example, a light source emitting red light may be transferred to the first heat-dissipating fins 1521, so as to provide a more stable heat dissipation performance for the light source emitting red light and maintain the stability of the image quality effectively. On the other hand, a light source emitting green light may be transferred to the first heat-dissipating fins 1521, so as to provide a stronger heat dissipation performance for the light source emitting green light and maintain the heat-dissipating quality of the projection apparatus effectively. In an embodiment, the first heat-dissipating fins 1521 and the second heat-dissipating fins 1531 may be different in sizes, and correspond to different openings. For example, the light source emitting green light may be transferred to the second heat-dissipating fins 1531, and the second heat-dissipating fins 1531 is larger than the first heat-dissipating 1521 or the second opening 1132 larger than the first opening 1131, so as to provide a stronger heat dissipation performance for the light source emitting green light and maintain the heat-dissipating quality of the projection apparatus effectively. The air outside the casing 110 may be guided into the casing 110 via the air inlet 111 by the first fan 130 and the second fan 140, and then sequentially passing through the first heat-dissipating fin set 152, the first fan 130, the second heat-dissipating fin set 153, and the second fan 140, and eventually left the casing 110 via the air outlet 112. When passing through the heat sink assembly 150, the air outside the casing 110 brings the heat coming from the light source device 160 and accumulating in the heat sink assembly 150 toward the projection lens 120 and the second fan 140. On the basis of not expanding the volume of the projection apparatus 100, not reducing the heat sink assembly 150, and not making a special design for the heat sink assembly 150, since the second rotational speed of the second fan 140 is larger than the first rotational speed of the first fan 130 in the projection apparatus of the embodiment, not only the heat accumulated in the heat sink assembly 150 may be quickly taken away, but also the air flow passing through the heat sink assembly 150 and bringing with a large amount of heat may quickly pass through the projection lens 120, arrive at the second fan 140, and left the inside of the casing 110 from the air outlet 112, and thereby effectively reducing the temperature of the heat sink 150 and the temperature of the airflow inside the casing 110, and avoiding overheating of the light source device 160 and degradation of the image quality.

In addition, by the arrangement of the opening portion 113 corresponding in position with the heat sink assembly 150, air with lower temperature relative to the air flow in the casing 110 may be additionally guided in or a part of the air flow in the casing 110 may be guided out, so that the temperature of the air flow in the casing 110 is decreased before arriving at the projection lens 120 or the amount of the air flow increasing in temperature when it passes through the heat sink assembly 150 and arriving at the projection lens 120 is reduced, thereby reducing the risk of lowering image quality. Further, in the embodiment, the second opening 1132 may be arranged to guide the external air in or the internal air flow out. When the second opening 1132 is arranged to guide the external air in, the heat dissipation efficiency of the second heat-dissipating fin set 153 is increased, so as to decrease the temperature of the air flow arriving at the projection lens 120 after passing through the second heat-dissipating fin set 153. When the second opening 1132 is arranged to guide the internal air out, a part of the air flow passing through second heat-dissipating fin set 153 is guided out of the casing 110, so as to reduce the amount of the air flow arriving at the projection lens 120. In an embodiment, the arrangement of guiding the internal air flow out or the external air in may be achieved by adjusting the first rotational speed of the first fan 130 and the second rotational speed of the second fan 140. For example, by means of adjusting the first rotational speed to be less than 20% of the second rotational speed, the second opening 1132 is arranged to guide the external air in. By means of adjusting the first rotational speed to be larger than 20% of the second rotational speed, the second opening 1132 is arranged to guide the internal air flow out. In an embodiment, the first rotational speed of the first fan 130 may be 1150 R.P.M., and the second rotational speed of the second fan 140 may be 200 R.P.M. With such arrangement of the rotational speeds and the disposition of the opening portion 113, the temperatures of the first heat-dissipating fin set 152 and the second heat-dissipating fin set 153 can be reduced by 7%, and further, the air temperature near the projection lens 120 can be effectively reduced by 10%. On the other hand, the first opening 1131 corresponding to the first heat-dissipating fin set 152, may also, by the user according to the first opening 1131 and the differences between the first rotational speed and second rotational speed, be arranged to guide the external air in or the internal air flow out, and the above effects can also be achieved.

Figure 6:
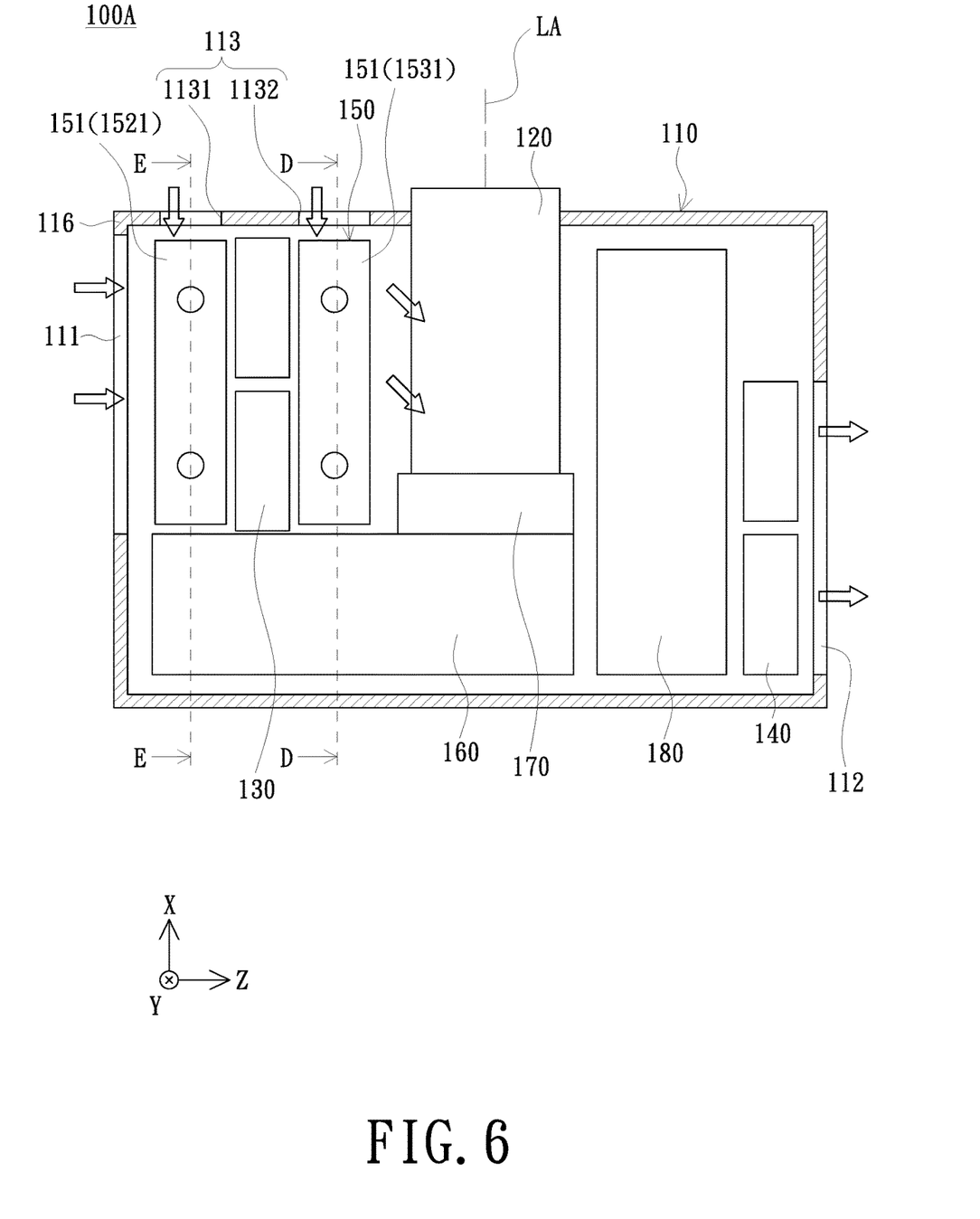
FIG. 6 is a schematic system configuration of a projection apparatus according to another embodiment of the invention.
Figure 7:
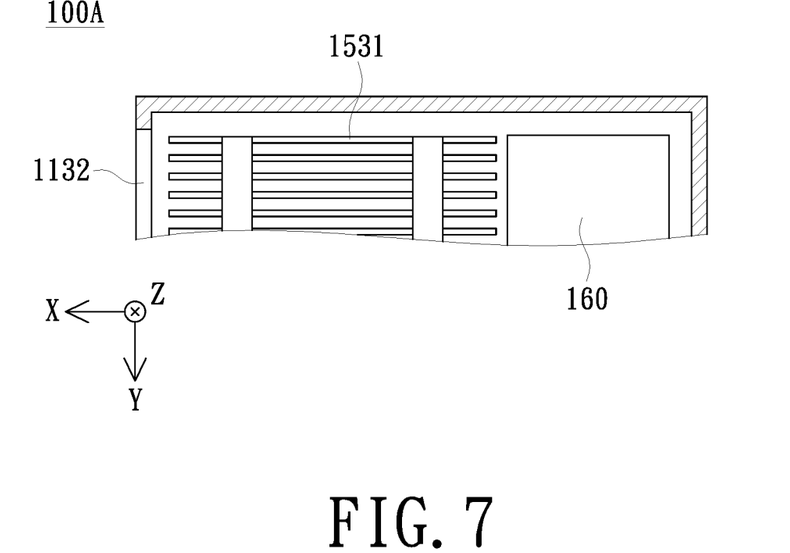
FIG. 7 is a schematic sectional view along a D-D cut line in FIG. 6.
Figure 8:
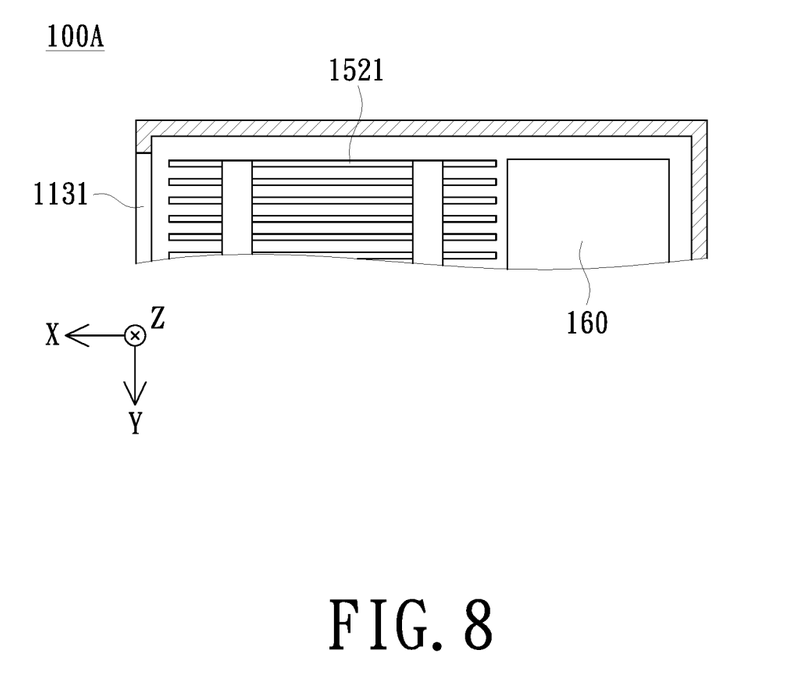
FIG. 8 is a schematic profile drawing along a E-E cut line in FIG. 6.

FIG. 6 is a schematic system configuration of a projection apparatus according to another embodiment of the invention. FIG. 7 is a schematic sectional view along a D-D cut line in FIG. 6. FIG. 8 is a schematic profile drawing along an E-E cut line in FIG. 6.

Referring to FIGS. 6 to 8, the major differences between the projection apparatus 100A of the embodiment and the projection apparatus 100 of the aforementioned embodiment are described herein. The opening direction of the opening portion 113 faces toward the first direction X, and the heat-dissipating fins 151 are sequentially arranged at intervals along the second direction Y. Specifically, the first opening 1131 of the opening portion 113 faces toward the first direction X, the second opening 1132 of the opening portion 113 faces toward the first direction X, and the first heat-dissipating fins 1521 are sequentially arranged at intervals along the second direction Y, the second heat-dissipating fins 1531 are sequentially arranged at intervals along the second direction Y. In addition, the third side wall 116 is the front side wall of the rectangular; that is, the first opening 1131 and the second opening 1132 of the opening portion 113 are disposed at the front side wall (the third side wall 116) of the front side of the projection apparatus 100A. In an embodiment, the opening portion 113 may be disposed at different side walls. For example, the opening direction of the first opening 1131 faces the first direction X and the opening direction of the second opening 1132 faces the second direction Y.

When the projection apparatus 100A of the embodiment is in use, the heat sink 150 next to the first fan 130 may be disposed on the heat transfer path of the light source device 160. The external air outside the casing 110 may be guided into the casing 110 via the air inlet 111 disposed at the left side wall by the first fan 130 and the second fan 140, and then sequentially passing through the first fan 130, the heat sink 150, the projection lens 120, the light valve 170, the power component 180 and the second fan 140, and eventually left the casing 110 via the air outlet 112 disposed at the right side wall. When the air flow entering the casing 110 passing through the heat sink assembly 150, the heat coming from the light source device 160 and accumulating on the heat sink assembly 150 may be brought to the projection lens 120 and the second fan 140. The opening portion 113 disposed on the third side wall 116 may additionally guide the air with lower temperature relative to the air flow in the casing 110 in or guide a part of the air flow in the casing 110 out, so that the temperature of the air flow in the casing 110 is decreased before arriving at the projection lens 120 or the amount of the air flow passing through the heat sink 150 and arriving at the projection lens 120 is reduced, thereby reducing the risk of lowering image quality. The detail contents that the opening portion 113 is arranged to guide the external air in or the internal air flow out can refer to aforementioned contents, and are not described herein.

Figure 9:
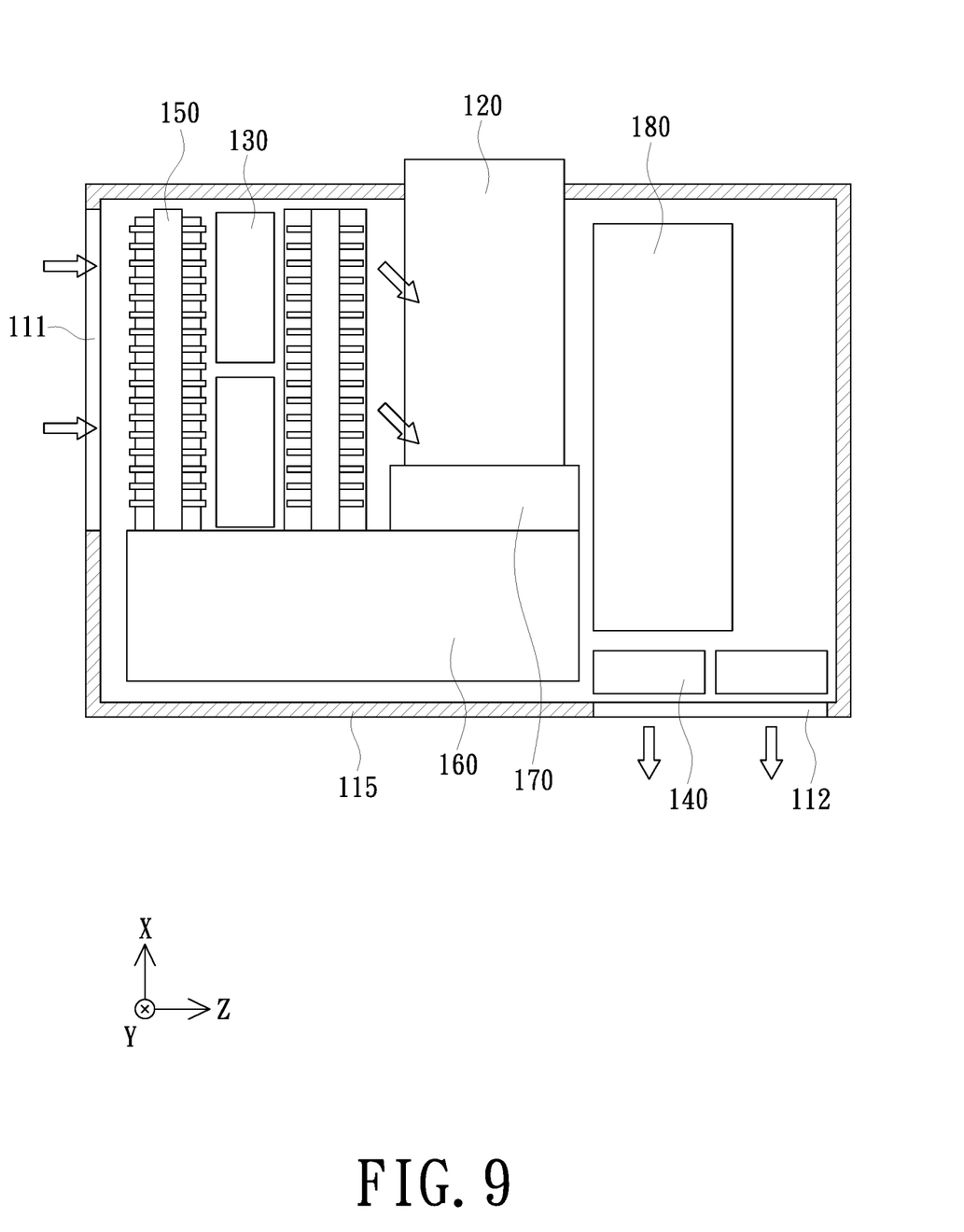
FIG. 9 is a schematic system configuration of a projection apparatus according to the other embodiment of the invention.

FIG. 9 is a schematic system configuration of a projection apparatus according to the other embodiment of the invention. Referring to FIG. 9, the major differences between the projection apparatus 100B of the embodiment and the projection apparatus 100 of the aforementioned embodiment are described herein. The second side wall 115 is the back side wall of the back of the projection apparatus 110B which is the rectangular; that is, the air outlet 112 is disposed at the back side wall. The external air outside the casing 110 may be guide into the casing 110 via the air inlet 111 disposed at the left side wall by the first fan 130 and the second fan 140, and then sequentially passing through the heat sink 150 (1521), the first fan 130, the heat sink 150(1531), the projection lens 120, the light valve 170, the power component 180, the light source device 160, and the second fan 140, and eventually left the casing 110 via the air outlet 112 disposed at the back side wall.

Based on the above, the projection apparatuses of the embodiments of the invention, since the second rotational speed of the second fan is larger than the first rotational speed of the first fan, on the basis of not expanding the volume of the projection apparatus, not reducing the heat sink assembly, and not making a special design for the heat sink assembly, not only the heat accumulated in the heat sink assembly may be quickly taken away, but also the air flow passing through the heat sink assembly and bringing with a large amount of heat may quickly pass through the projection lens, arrive at the second fan, and left the inside of the casing from the air outlet, and thereby effectively reducing the temperature of the heat sink and the temperature of the airflow inside the casing and avoiding overheating of the light source device and degradation of the image quality. In addition, the opening portion may be arranged to guide the external air in or the internal air flow out by the magnitudes of the first rotational speed and the second rotational speed. Therefore, the projection apparatuses of the embodiments of the invention have the advantages of low development cost and effectively lowering the influence of the heat on the image quality at the same time.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "The invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims. Furthermore, the terms such as the first fan, the second fan, the first side wall and the second side wall are only used for distinguishing various elements and do not limit the number of the elements.

What is claimed is:

1. A projection apparatus, comprising a casing, a projection lens, a first fan, a second fan, and a heat sink assembly, wherein:
    the casing comprises a first side wall, a second side wall, and a third side wall, and the third side wall is connected between the first side wall and the second side wall, wherein an air inlet is formed on the first side wall, an air outlet is formed on the second side wall, and an opening portion is disposed on the third side wall;
    the projection lens is disposed in the casing, and between the air inlet and the air outlet;
    the first fan is disposed in the casing, and between the projection lens and the air inlet;
    the second fan is disposed in the casing, and between the projection lens and the air outlet; and
    the heat sink assembly is disposed in the casing and between the projection lens and the air inlet;
    wherein the first fan has a first rotational speed, the second fan has a second rotational speed, and the second rotational speed is larger than the first rotational speed,
    wherein the heat sink assembly comprises a first side and a second side, the first side is in alignment with and adjacent to the air inlet and the second side is in alignment with and adjacent to the opening portion.

2. The projection apparatus according to claim 1, wherein the heat sink assembly comprises a plurality of heat-dissipating fins, the heat-dissipating fins are disposed between the first fan and the air inlet, or between the first fan and the projection lens.

3. The projection apparatus according to claim 1, wherein the heat sink assembly comprises a plurality of heat-dissipating fins, the heat-dissipating fins are sequentially arranged at intervals, and an axial direction of the first fan and an arrangement direction of the heat-dissipating fins are not parallel.

4. The projection apparatus according to claim 3, wherein the arrangement direction of the heat-dissipating fins and an opening direction of the opening portion are not parallel.

5. The projection apparatus according to claim 1, wherein the heat sink assembly comprises a first heat-dissipating fin set and a second heat-dissipating fin set, the first heat-dissipating fin set is disposed between the first fan and the air inlet, the second heat-dissipating fin set is disposed between the first fan and the projection lens, and the opening portion comprises a first opening and a second opening, the first opening is in alignment with the first heat-dissipating fin set, the second opening is in alignment with the second heat-dissipating fin set.

6. The projection apparatus according to claim 5, wherein an aperture of the first opening is different from an aperture of the second opening.

7. The projection apparatus according to claim 6, wherein the aperture of the second opening is larger than the aperture of the first opening.

8. The projection apparatus according to claim 1, wherein the projection apparatus further comprises a light source device, a light valve, and a power component, the light source device, the light valve, and the power component are disposed in the casing, the light source device is configured to provide an illumination beam, the light valve is positioned on a transmissive path of the illumination beam to convert the illumination beam into an image beam, the projection lens is disposed on a transmissive path of the image beam to project the image beam, the power component is positioned between the projection lens and the second fan and provides an electric power to the projection apparatus, and, the light source device is closer to the air inlet than the projection lens, and the light valve and the power component are closer to the air outlet than the projection lens.

* * * * *